PARALLEL OPERATION OF TETRODE TRANSISTORS

Filed Nov. 20, 1959

INVENTOR.
JAMES LEE JENSEN
BY Osmund R. Dahle
ATTORNEY 3,016,494
Patented Jan. 9, 1962

3,016,494

PARALLEL OPERATION OF TETRODE TRANSISTORS

James Lee Jensen, St. Louis Park, Minn., assignor to Minneapolis-Honeywell Regulator Company, Minneapolis, Minn., a corporation of Delaware Filed Nov. 20, 1959, Ser. No. 854,333
5 Claims. (Cl. 330—24)

The present invention relates generally to new and improved amplifying circuits and more specifically to amplifying circuits wherein a plurality of tetrode type amplifying means are operated in parallel so as to supply a substantial current to a common load.

It is often true in electronic amplifying circuits that the amount of current which can be delivered to a load is limited by the power dissipation rating of the active elements used therein. This limitation is perhaps felt most severely in amplifying circuits wherein transistors are used as the active elements. For example, even in applications where present day power transistors may be utilized, the amount of power which can be handled by a single transistor when acting in a switching mode is somewhere in the neighborhood of 1000 watts. In applications where higher load requirements are specified than can be attained with a single transistor, one approach that has been followed is to operate two or more transistors in parallel. This approach is often times unsuccessful due to the fact that it is quite difficult to find two transistors with matched parameters such that the amount of current flowing through each of said paralleled transistors remains equal. Unless some stabilization scheme is resorted to, a runaway condition may develop whereby a single one of the parallel transistors tends to assume the full load current and is destroyed. After this first transistor is destroyed, remaining ones of said parallel transistors are forced to bear a proportionally higher share of the total load current and hence are themselves rapidly destroyed.

It is accordingly an object of the present invention to provide a new and improved stabilizing scheme whereby a plurality of tetrode amplifying devices may be operated in a parallel mode.

Another object of this invention is to provide means for successfully operating two or more tetrode type transistors in parallel.

Still another object of the present invention is to provide improved means for proportioning the total load current between a plurality of tetrode amplifying devices in spite of differences in their parameters.

A further object of this invention is to provide a means whereby a signal proportional to the difference between the current flowing through a number of tetrode transistors arranged in parallel is developed and used to control the conductivity of said tetrodes such that they are forced to share total current flowing to the load.

Still other objects of the invention will become apparent upon a more comprehensive understanding of the invention for which reference is had to the following specification, claims and drawings.

Briefly, the circuits of this invention incorporate means for sensing the amount of current flowing through each of a plurality of amplifying devices connected in parallel and for developing signals proportional to these currents. Feedback means are provided for impressing these signals on the control electrodes of these amplifying devices such that, under operating conditions, the paralleled units will share the current load in a predetermined ratio.

Figure 1:
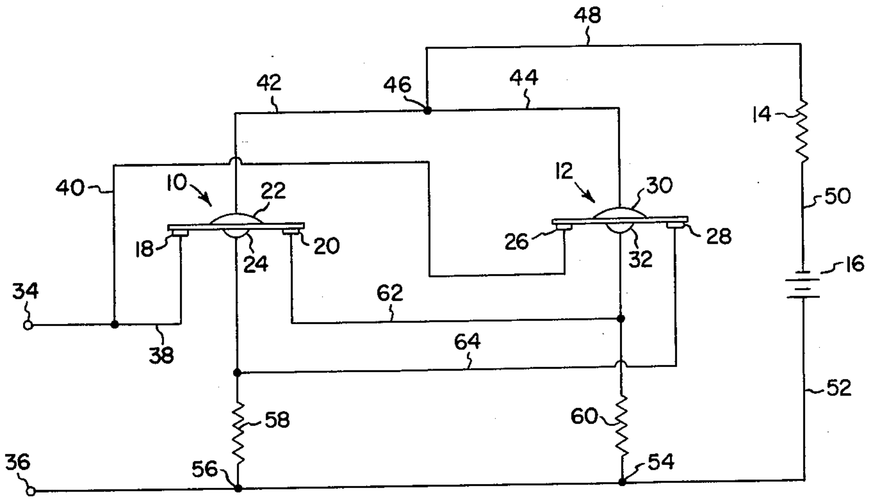
FIGURE 1 illustrates schematically a first embodiment of this invention.

In the exemplary embodiment shown in FIGURE 1 of the drawings a pair of semiconductor type amplifying devices 10 and 12 are connected in a parallel relationship with one another and in series with a load or utilization device 14 and a source of energizing potential 16. More specifically, these semiconductor amplifying devices are preferably both of the tetrode type and, as such, tetrode 10 is provided with a plurality of electrodes including a pair of control or base electrodes 18 and 20, an output or collector electrode 22, and a common or emitter electrode 24. Similarly, a pair of control or base electrodes 26 and 28, an output or collector electrode 30, and a common or emitter electrode 32 are associated with amplifying device 12. Tetrodes 10 and 12 are preferably of the type prepared in accordance with the teaching in the copending application of Joseph T. Maupin, Serial No. 556,210, filed December 29, 1955 and assigned to the assignee of the present application. However, since the paralleling schemes of this invention may work equally well with the semiconductor tetrodes prepared in the other ways, limitation to the preferred type is not intended.

A pair of signal input terminals 34 and 36, adapted to be connected to a source of input signals to be amplified, are also included in the circuit of FIGURE 1. Terminal 34 is connected by means of a conductor 38 to the first base electrode 18 on transistor tetrode 10. Likewise, the first base electrode 26 on tetrode 12 is connected via a conductor 40 to the signal input terminal 34. The output electrodes 22 and 30 of tetrodes 10 and 12, respectively, are brought out by means of conductors 42 and 44 to a common junction point 46. Conductor 48 connects one side of the load 14 to the junction 46. The other side of load 14 is connected serially with a first terminal of the source of energizing current 16, here shown as a battery, by means of a conductor 50. The other terminal of source 16 is connected via a conductor 52 and junctions 54 and 56 to the second signal input terminal 36. Connected between the emitter electrode 24 of tetrode 10 and junction 56 on conductor 52 is a current sensing element, here shown as a resistor 58. Similarly, there is connected between the emitter electrode 32 of tetrode 12 and the junction 54 on conductor 52 a second current sensing element 60, also shown here as a resistor. Conductor means 62 and 64, respectively, connect the second base electrode 20 of semi-conductor tetrode 10 to the emitter electrode 32 of semi-conductor tetrode 12 and the second base electrode 28 of tetrode 12 to the emitter electrode 24 of tetrode 10. It may be seen then that tetrodes 10 and 12 are connected in parallel, one branch of the parallel circuit being traced from junction 54 through resistor 60, through the emitter to collector junction of tetrode 12 and through conductor 44 to junction 46, and the other branch being traced from junction 56, through resistor 58, through the emitter to collector junction of tetrode 10 and conductor 42 to junction 46. The load 14 and the source 16 being connected in series between junction 46 and junction 54 are therefore also connected in series with each of the branches as defined above.

*Operation*

As is quite well known in the transistor art, the impedance offered to the flow of current between the emitter junction and the collector junction of a transistor may be varied by varying the signal current applied to its associated base electrode with respect to the emitter electrode. This same type of operation may also be observed in semiconductor transistors of the tetrode type.

However, in the transistor tetrode there is available a pair of base or control electrodes to which separate control signals may be applied with respect to the emitter electrode. These two control electrodes, which are physically remote from each other and which may be on opposite sides of the emitter junction from each other, as shown in the copending application mentioned above, operate somewhat independently in that a signal on either base can control the output current and also a control signal of one polarity applied to a first base electrode may be partially compensated by a control signal of the opposite polarity applied to the other base electrode. For example, if tetrode 10 is of the PNP type and is biased by means, not shown, to operate Class A, a negative signal applied to its base electrode 18 results in an increase in the current flowing from emitter junction 24 to the collector junction 22. Now, if at the same time a positive signal is applied to the second base electrode 20 of tetrode 10, the conductivity between the emitter and collector junction tends to be reduced which tends to reduce the effect of the aforementioned negative control signal.

The means whereby two or more of said tetrodes are forced to share the total load current will now be described. Assuming that a signal to be amplified is applied to the signal input terminals 34 and 36 and tetrodes 10 and 12 are biased for Class A operation, upon the positive excursion of said signal, a positive potential is applied by means of conductor 38 to the base electrode 18 of tetrode 10 and through conductor 40 to the base electrode 26 of tetrode 12. As a result, there will be a reduction in the current flowing from potential source 16 through conductor 52, and through each branch of the parallel circuit which contains tetrodes 10 and 12 respectively. If it should happen, that because of a difference in parameters in the two tetrodes, that one of said tetrodes carries more than its proportionate share of the current flowing through the load, there will be a difference in the voltage developed across the resistive elements 58 and 60. For example, if it is assumed that tetrode 10 is conducting more heavily than tetrode 12 there will be a greater voltage drop across the resistor 58 than exists across resistor 60. As a result, the signal applied to the second base electrode 28 of tetrode 12 through conductor 64 will be more negative than the signal applied to the second base electrode 20 of tetrode 10 through conductor 62. It can be seen that with a more negative signal applied to base electrode 28 the conductivity between the emitter electrode 32 and the collector electrode 30 of tetrode 12 is increased and hence there results an increase in current flowing through the branch of the parallel circuit containing tetrode 12. This increase tends to equal the initially assumed increase in current flowing through the parallel branch containing tetrode 10 and therefore balances the total load current between the two tetrodes. Because of the manner in which the base electrodes 20 and 28 are cross-coupled, if tetrode 12 should tend to carry more than its proportionate share of the load current, the voltage drop across resistor 60 will exceed that developed across resistor 58 and, as a result, a more negative signal wil be applied to the second base electrode 20 of tetrode 10 through conductor 62 than is applied to the second base electrode 28 of tetrode 12 through conductor 64. When this condition exists, the impedance offered between the emitter electrode 24 and collector electrode 22 of tetrode 10 is reduced and hence there is an increase in current flowing through the parallel branch containing tetrode 10 tending to bring the system into balance. It can be seen then that by including the current sensing resistors 58 and 60 and by cross-coupling the emitter electrode 24 of tetrode 10 to the second base electrode 28 of tetrode 12 and the emitter electrode 32 of tetrode 12 with the second base electrode 20 of tetrode 10, the two parallel connected tetrodes are forced to share in a predetermined proportion the amount of current flowing from source 16 through load 14. By properly adjusting the impedance of resistors 58 and 60 the proportion of the current flowing through each branch of the parallel circuit may be set at a predetermined value.

It is of course possible to extend the stabilizing technique of this invention so that more than two tetrodes may be connected in parallel by merely including a suitable voltage dividing network between respective ones of the emitter electrodes of the paralleled tetrodes and therefore, the invention should not be construed as limited to the operation of only two tetrodes in parallel.

*FIGURE 2*

Before describing the operation of the embodiment of FIGURE 2, the detailed description of the circuit connection will now be given. Since the circuit layout is somewhat similar to that of FIGURE 1 like parts will be given the same reference numerals. Here again a pair of transistor tetrodes 10 and 12 are connected in parallel with a series circuit including a load or utilization device 14 and a source of energizing potential 16. The tetrode 10 is again provided with a pair of base or control electrodes 18 and 20, a collector or output electrode 22, and an emitter or common electrode 24. Tetrode 12 is likewise provided with a pair of base electrodes 26 and 28, collector electrode 30, and an emitter electrode 32. A first signal input terminal 34 is connected to the base electrode 18 on tetrode 10 by means of conductor 38 and to the base electrode 26 on tetrode 12 by means of a conductor 40. The collector electrodes 22 and 30 are connected in parallel by means of conductors 42 and 44 to a common junction 46. A conductor 48 connects junction 46 to one side of the load or utilization device 14, here shown as a resistor. Conductor 50 connects the other side of load 14 to a first terminal of the source of energizing potential 16. The other terminal of source 16 is connected by means of conductor 52 to a junction 54 and a junction 56 and to second signal input terminal 36. Connected between the junction 56 and the emitter electrode 24 of tetrode 10 is a resistor 58. Likewise, connected between the junction 54 and the emitter electrode 32 of tetrode 12 is a resistor 60.

The means used to detect the difference in current flowing through resistors 58 and 60 is a differential amplifier 65 shown here as preferably being comprised of a pair of triode type transistor amplifying devices 66 and 67. Transistor 66 is provided with a base electrode 68, an emitter electrode 70 and a collector electrode 72. Similarly transistor 67 is provided with a base electrode 74, an emitter electrode 76 and a collector electrode 78. Differential amplifier 65 is biased for Class A operation by means of a potential source 80 and a biasing resistor 82. These last mentioned two components are connected in series between the aforementioned junction 56 and a junction 84 which is the common junction between the emitter electrodes 70 and 76 of transistor triodes 66 and 67. The base or input electrode 68 of transistor 66 is connected by means of conductor 86 to the junction 88 between the emitter electrode 24 of tetrode 10 and its associated coupling resistor 58. Likewise the base or input electrode 74 of transistor 67 is connected by means of conductor 90 to a junction point 92 between the emitter electrode 32 of tetrode 12 and its associated coupling resistor 60. The collector or output electrode of transistor 66 is connected by means of conductor 94 to the control electrode 20 of tetrode 10. In a like manner the collector or output electrode of transistor 67 is connected by means of a conductor 96 to the control electrode 28 of tetrode 12.

Figure 2:
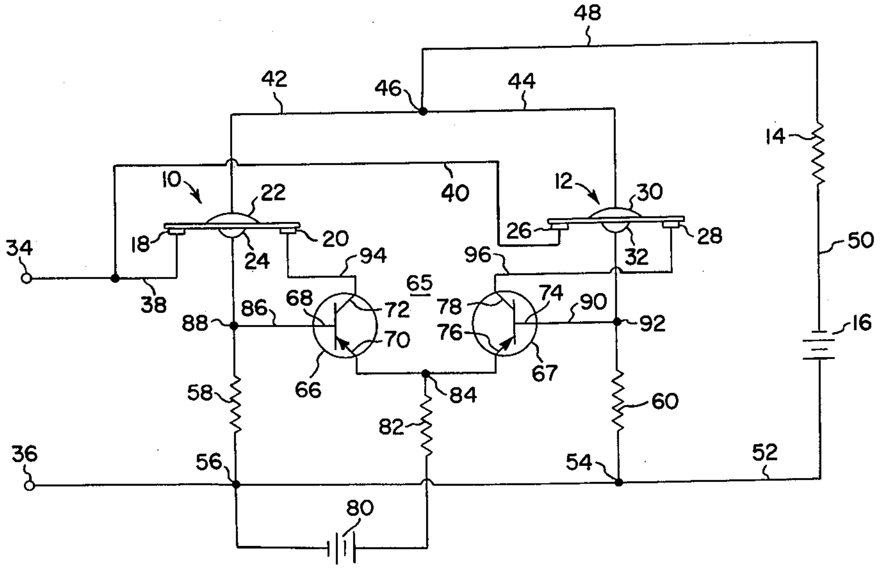
FIGURE 2 illustrates another embodiment of this invention wherein a differential amplifier is the means employed to insure stabilization of the parallelly operated tetrode amplifiers.

*Operation of FIGURE 2*

Again, as in FIGURE 1, signals to be amplified are applied to the input terminals 34 and 36. Since one base electrode on each of the semiconductor tetrodes 10 and 12 is connected in common with source terminal 34 by means of conductors 38 and 40, respectively, the conductivity of the transistors 10 and 12 will be varied in accordance with the variations of the input signal. In order to insure that the total load current is shared between each of the tetrode amplifying devices in substantially equal proportions, use is made of the differential amplifier 65. Differential amplifier 65 is normally biased for Class A type operation by means of the potential source 80 and the biasing resistor 82 located in series therewith. Assuming initially that the system is in balance such that equal amounts of current flow through each of the parallel branches, if resistors 58 and 60 have equal values of resistance the same signal will be applied to the base electrode 68 of transistor 66 as is applied to the base electrode 74 of transistor 67. As a result, the current flowing from potential source 80 and through biasing resistor 82 will be split equally at junction 84 such that the current flowing from the emitter to the collector electrode of transistor 66 is equal to the current flowing from the emitter to the collector electrode of transistor 67. Since the collector or output electrode 72 of transistor 66 is connected by means of conductor 94 to a base or control electrode 20 on tetrode 10, and since the collector electrode 78 of transistor 67 is connected by means of conductor 96 to a base or control electrode 28 of transistor 12, equal base currents will be supplied to tetrodes 10 and 12. If the characteristics of tetrode 10 are identical to those of tetrode 12 the current flowing from the emitter to the collector electrodes of each of said tetrodes will be equal. However, if the characteristics of the two tetrodes are not perfectly matched, more current may flow through one tetrode than through the other. Assuming it is tetrode 10 which carries more than its proportionate share of the total load current it can be seen that the signals developed across the resistors 58 and 60 will no longer be equal. The signal applied to the base electrode 68 of transistor 66 through conductor 86 will be more negative than the signal applied to the base electrode 74 of transistor 67 through conductor 90. This results in a relative decrease in the impedance offered between the emitter electrodes 70 and the collector electrode 72 of the transistor 66. Therefore, by simple voltage divider action it can be seen that the signal current applied to the base electrode 20 of tetrode 10 will be made more positive and that applied to the base electrode 28 of tetrode 12 less positive. The effect of this unbalance in signal currents is to increase the impedance between the emitter and collector electrodes of tetrode 10 and hence reduce the magnitude of the current flowing through this branch of the parallel circuit. Similarly, since base electrode 28 is now less positive, the current flowing through tetrode 12 will increase. It can be seen then that the differential amplifier 65 is responsive to the differential in current flowing through each branch of the parallel connected amplifying means and produces a signal proportional to said differential. Because of the manner in which the output electrodes of said differential amplifier are connected to the control electrodes of the semiconductor tetrodes, the signals produced by said differential amplifier causes the differential in current to be minimized.

As another example of the circuit operation, assume that it is tetrode 12, i.e., the branch of the parallel circuit connected between junctions 54 and 46, that is carrying more than its proportional share of the total load current. With this situation existing the voltage drop appearing across resistor 60 will exceed that appearing across resistor 58, and hence, the base electrode 74 of transistor 67 will be at a more negative potential than will be the base electrode 68 of transistor 66. The impedance seen between the emitter and collector electrodes of transistor 67 will therefore be less than that observed between the emitter and collector electrodes of transistor 66. This results in a more positive signal being applied to the base electrode 28 of tetrode 12 and a less positive signal applied to the base electrode 20 of tetrode 10. This increase in signal on base electrode 28 results in a reduction in the conductivity between the emitter electrode 32 and the collector electrode 30 of tetrode 12. Similarly the conductivity between the emitter electrode 24 and collector electrode 22 is increased to increase the conductivity of tetrode 10.

Thus it is apparent that this invention provides means whereby the various objects and advantages may successfully be achieved.

While I have shown and described the preferred embodiments of my invention, it will be understood that the latter may be embodied otherwise than as herein specifically illustrated or described and that in the illustrated embodiments certain changes in the details and construction and in the arrangement of components may be made without departing from the underlying scope of the invention.

What is claimed as new and for which it is desired to secure by Letters Patent is:

1. In an electronic circuit having a plurality of paralleled tetrode semiconductor amplifier means adapted to equalize the currents flowing therethrough, the combination comprising: a plurality of similar tetrode semiconductor amplifier means each having a plurality of electrodes including first and second control electrodes, a collector electrode and an emitter electrode; means connecting said first control electrodes in common with a signal input source; means connecting said collector electrodes in parallel with each other and in series with a source of direct current and load means; and resistor means connected in series with each of said emitter electrodes for developing voltages thereacross, respectively, proportional to the magnitude of the current flowing through the corresponding emitter electrode, and circuit means coupling said second control electrodes on each of said plurality of amplifying means to said resistor means associated with another of said plurality of amplifying means in a phase direction such that an unbalance in the currents of said plurality of amplifier means produces corrective potentials to the second control electrodes such that said plurality of amplifying means are forced to share in a predetermined proportion the current flowing from said source to said load means.

2. In an electronic circuit, the combination comprising: at least first and second tetrode semiconductor amplifying means, each having an emitter electrode, a collector electrode and first and second base electrodes; means connecting said first base electrodes in common with a first signal input terminal; means connecting said collector electrodes in parallel with one another and in series with a source of direct current, load means, and a second signal input terminal; means including first and second resistor means coupling said emitter electrodes, respectively, to said second signal input terminal, said first and second resistor means each having a potential developed thereacross proportional to the current flowing in the corresponding emitter electrode; means coupling said second base electrode on said first tetrode amplifying means in phase to said emitter electrode on said second tetrode amplifying means, and means coupling said second base electrode on said second tetrode amplifying means in phase to said emitter electrode on said first tetrode amplifying means such that said first and second tetrode amplifying means are forced to share in a desired manner the current flowing from said source to said load.

3. In an electronic circuit, the combination comprising: a plurality of similar semiconductor amplifying means each having at least four electrodes including first and second control electrodes, a collector electrode, and an emitter electrode; means for applying an input signal to said first control electrodes, means connecting said collector electrodes in parallel with one another, and in series with load means and circuit energizing means; impedance means connected in series with each of said emitter electrodes, said impedance means each being further connected in series with said circuit energizing means and said load means for developing a voltage across each of said impedance means, respectively, proportional to the magnitude of the current flowing through the corresponding amplifying means, and circuit means connected to each of said impedance means and cross coupled to the second control electrode of another of said semi-conductor means for applying cross coupled feedback voltage components proportional to and in phase with current in each of said impedance means to said second control electrodes of said other semiconductor means in a phase direction such that an unbalance in the currents of said plurality of amplifying means produces corrective potentials to the second control electrodes such that said amplifying means are forced to share in a predetermined proportion the current flowing from said energizing means to said load means.

4. In an electronic circuit, the combination comprising: a plurality of similar semiconductor amplifying means each having at least four electrodes including first and second control electrodes, a collector electrode, and an emitter electrode; means for applying an input signal to said first control electrodes, means connecting said collector electrodes in parallel with one another and in series with a source of electrical energy and load means; a plurality of impedance means each connected in series with each of said emitter electrodes and with said source and said load means for developing a voltage across each of said impedance means, respectively, proportional to the magnitude of the current flowing through the corresponding amplifying means, differential amplifier means having a plurality of input circuits and a plurality of output circuits corresponding to said plurality of semi-conductor amplifying means, means connecting each of said input circuits to the impedance means associated with the emitter electrode of the corresponding semi-conductor amplifier means, means connecting each of said output circuits between the emitter electrode and the second control electrode of said corresponding semi-conductor amplifying means to vary the emitter-collector conductivity thereof, said differential amplifier means being so phased that an increase in the voltage drop across one of the impedance means will relatively change the currents flowing through said output circuits in such a direction that the current in the output circuit associated with the second control electrode of the corresponding semi-conductor amplifying means will change in a direction to decrease the current flowing between the emitter and collector thereof and the current in the output circuit connected to the second control electrode of another semi-conductive device will change in the opposite direction to increase the current flowing between the emitter and collector of said other device so that the currents flowing through said semi-conductor devices to said load assume a desired relation to each other.

5. In an electronic circuit, the combination comprising: first and second tetrode semiconductor amplifying means each having a plurality of electrodes including a pair of control electrodes, a collector electrode, and an emitter electrode; means connecting one of said pair of control electrodes of said first tetrode amplifying means in common with one of said pair of control electrodes of said second tetrode amplifying means and with a first signal input terminal; means connecting said collector electrodes of said first and second tetrode amplifying means in parallel with one another and in series with a source of voltage, load means, and a second signal input terminal; emitter circuit coupling means including first and second resistor means coupling said second signal input terminal to said emitter electrodes, respectively, of said first and second tetrode amplifying means; phase inverting first and second triode semiconductor differential amplifying means each having an input electrode, an output electrode, and a common electrode and each producing a phase inversion between its input and output electrode; means connecting the output electrode of said first triode amplifying means to the other one of said pair of control electrodes of said first tetrode amplifying means; means connecting the output electrode of said second triode amplifying means to the other one of said pair of control electrodes on said second tetrode amplifying means; means connecting said input electrode on said first triode amplifying means to said emitter circuit coupling means of said first tetrode amplifying means, means connecting said input electrode of said second triode amplifying means to said emitter circuit coupling means of said second tetrode amplifying means; and means including impedance means connecting said common electrodes of said first and second triode amplifying means in series with a biasing means of such polarity as to tend to reduce the conductivity of the tetrode amplifying means so that the bias applied to the other control electrodes of said first and second tetrode amplifying means is divided by said differential amplifying means in proportion to the currents flowing through said first and second resistor means to relatively affect the conductivity of said first and second tetrode amplifying means so that they are forced to share in a desired manner the current flowing from said source to said load.

References Cited in the file of this patent

UNITED STATES PATENTS

| | | |
|---|---|---|
| 2,775,657 | Van Zelst | Dec. 25, 1956 |
| 2,807,678 | Rapp | Sept. 24, 1957 |